US007507441B2

(12) United States Patent
Champion et al.

(10) Patent No.: US 7,507,441 B2
(45) Date of Patent: Mar. 24, 2009

(54) METHOD FOR MAKING A PHOTONIC STRUCTURE

(75) Inventors: David Champion, Lebanon, OR (US); James O'Neil, Corvallis, OR (US); Peter Mardilovich, Corvallis, OR (US); Gregory S Herman, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 535 days.

(21) Appl. No.: 10/885,051

(22) Filed: Jul. 6, 2004

(65) Prior Publication Data

US 2006/0008582 A1    Jan. 12, 2006

(51) Int. Cl.
*C23C 16/00* (2006.01)
*B05D 5/06* (2006.01)

(52) U.S. Cl. .................................... 427/248.1; 427/162
(58) Field of Classification Search ........................ None
See application file for complete search history.

(56) References Cited

U.S. PATENT DOCUMENTS

| 4,309,810 | A | 1/1982 | Drake |
| 4,591,544 | A | 5/1986 | Sasa |
| 6,549,253 | B1 * | 4/2003 | Robbie et al. ............... 349/84 |
| 2004/0115954 | A1 * | 6/2004 | Todd ............................ 438/781 |

FOREIGN PATENT DOCUMENTS

| DE | 31 25 1050 A1 | 2/1982 |
| GB | 2 056 201 A | 3/1981 |
| GB | 2 056 503 A | 3/1981 |
| JP | 58061273 | 4/1983 |

OTHER PUBLICATIONS

Optoelectronics-University of Bath, BA2 7AY, UK, "Porous Silicon", http://www.bath.ac.uk/physics/groups/psilicon.html, May 11, 2004, pp. 1-2.*
Dr Paul Snow; Department of Physics, University of Bath, Claverton Down, Bath, BA27AY, "Photonic Band Gap Microcavities to Enhance and Control Light Emission From Porous Silicon:GR/L55353", https://dbi.cv.hp.com/dbid/fetch/88FS/file_pointer/grl55353.htm, May 11, 2004, pp. 1-2.
Optoelectronics-University of Bath, BA2 7AY, UK, "Porous Silicon", http//www.bath.ac.uk/physics/groups/opto/psilicon.html, May 11, 2004, pp. 1-2.
Lin, Shawn et al; "Silicon Three-dimensional Photonic Crystal and its Applications"; Sandia National Laboratories; Nov. 2001; Sandia Report, USA; 29 pages.
ISR dated Dec. 6, 2005 for Appn. No. PCT/US2005/022989.

* cited by examiner

*Primary Examiner*—Timothy Meeks
*Assistant Examiner*—Kelly M Stouffer
(74) *Attorney, Agent, or Firm*—Donald J Coulman

(57) ABSTRACT

A method for making a photonic structure, including creating a first vapor stream of a first vapor material, the first vapor stream having a first non-uniform flux in at least one direction; and moving a substrate in at least a portion of the vapor stream. In addition, the method includes depositing the first vapor material on a first major surface of said substrate, and forming a first layer and a density gradient in the first layer during deposition. The first layer is disposed on and the density gradient is in a direction perpendicular to the first major surface.

22 Claims, 7 Drawing Sheets

METHOD FOR MAKING A PHOTONIC STRUCTURE

BACKGROUND

Description of the Art

The demand for cheaper and higher performance electronic and opto-electronic devices has led to a growing need to manufacture electronic devices utilizing thin film technologies to generate ever more complex thin films. Photonic crystals and other photonic structures are good examples of the ever-increasing demands on the ability to form multilayer thin films having both complex chemical compositions as well as complex physical and mechanical properties.

Although incandescent lamps are inexpensive and the most widely utilized lighting technology in use today, they are also the most inefficient lighting source in regards to the amount of light generated per unit of energy consumed. An incandescent lamp works by heating a filament, typically tungsten, to a very high temperature so that it radiates in the visible portion of the electromagnetic spectrum. Unfortunately, at such high temperatures the filament radiates a considerable amount of energy in the non-visible infrared region of the electromagnetic spectrum. Photonic crystals are spatially periodic structures having useful electromagnetic wave properties, such as photonic band gaps. Photonic crystals having the proper lattice spacing offer the potential of improving the luminous efficiency of an incandescent lamp by modifying the emissivity of the tungsten filament. Such a filament, incorporated into a photonic crystal, would emit most if not all light in the visible portion of the spectrum and little or no light in the non-visible infrared portion. In addition, the incorporation of reflective and antireflective coatings in such a light source would further increase its efficiency.

Many of the methods currently available for the manufacture of photonic crystals are extremely costly. Other methods are unable to control the microscopic properties over macroscopic dimensions. The complexity in manufacturing photonic crystals and other photonic structures severely limits their applications.

If these problems persist, the continued growth and advancements in the use of electronic devices, especially in the area of photonic will be reduced. In areas like consumer electronics, the demand for cheaper, smaller, more reliable, higher performance electronics constantly puts pressure on improving and optimizing performance of ever more complex and integrated devices. The ability to optimize and control the physical and chemical properties of thin films will open up a wide variety of applications that are currently either impractical, or are not cost effective.

DESCRIPTION OF THE PREFERRED EMBODIMENTS

This invention is directed to various photonic structures utilizing multilayer films. The present invention provides a method of fabricating a wide variety of one dimensional photonic structures that include films having a gradient in the porosity or density of the film in a direction perpendicular to a major surface of a substrate on which the photonic structures are formed. By moving at least a portion of the substrate in at least a portion of a vapor stream the method of the present invention can fabricate a multilayer film where the gradient in the porosity or density of each layer is independently controlled. The method also provides the ability to generate multilayer films having a periodic change in the dielectric function in the nanometer regime that is desirable for controlling light in the visible region of the electromagnetic spectrum. Such films may be utilized in light sources, as well as forming reflective and anti-reflective coatings.

It should be noted that the drawings are not true to scale. Further, various elements have not been drawn to scale. Certain dimensions have been exaggerated in relation to other dimensions in order to provide a clearer illustration and understanding of the present invention. In particular, vertical and horizontal scales may differ and may vary from one drawing to another. In addition, although some of the embodiments illustrated herein are shown in two dimensional views with various regions having height and width, it should be clearly understood that these regions are illustrations of only a portion of a device that is actually a three dimensional structure. Accordingly, these regions will have three dimensions, including length, width, and height, when fabricated on an actual device. In addition, in some figures the change in density or porosity of a film is depicted utilizing a change in cross-hatching density and is meant only to illustrate a change in density and is not meant to represent any particular density or change in density. Further, in those figures graphically illustrating the density or porosity of a film it should be noted that 100 percent represents 100 percent density for the particular source being utilized, and may or may not represent the accepted or typical density of the particular material being deposited.

Figure 1A:
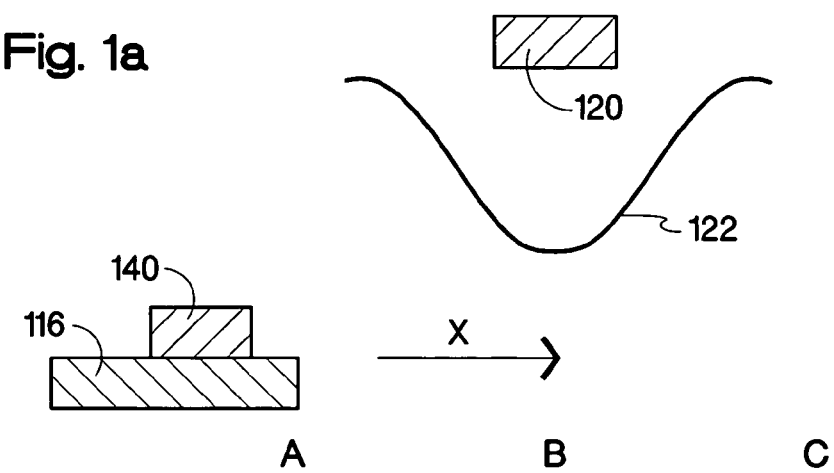
FIGS. 1a-1c are cross-sectional views of a vapor source and substrate utilized to form a photonic structure according to an embodiment of the present invention.
Figure 1B:
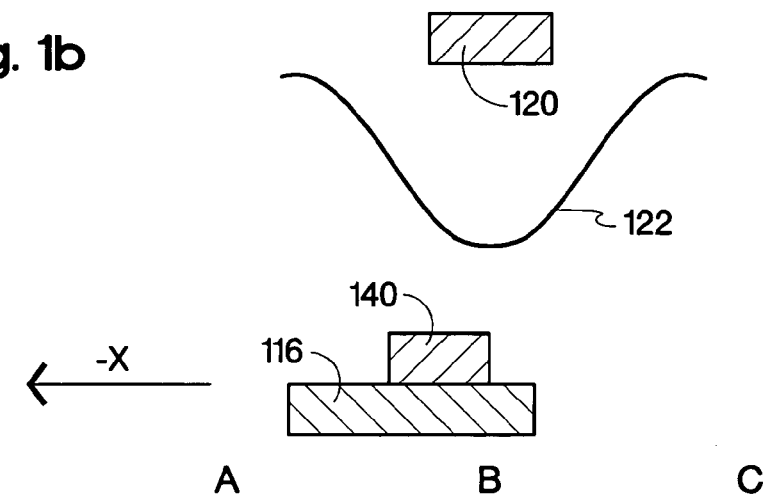
Figure 1C:
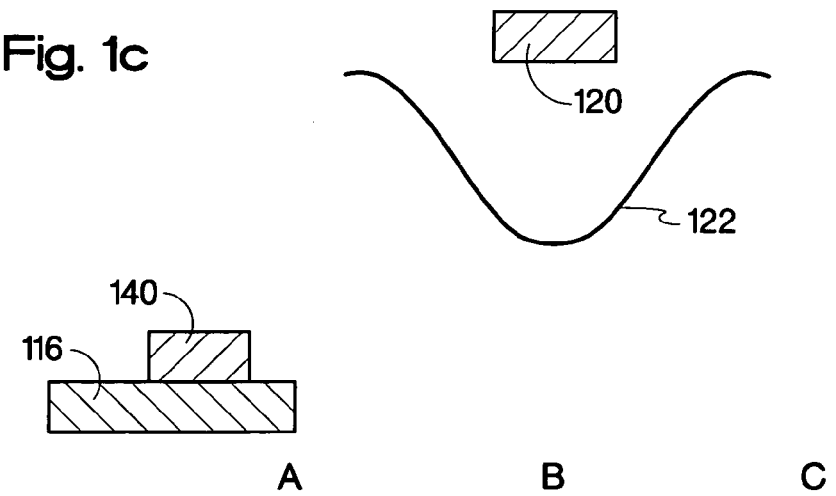
Figure 1D:
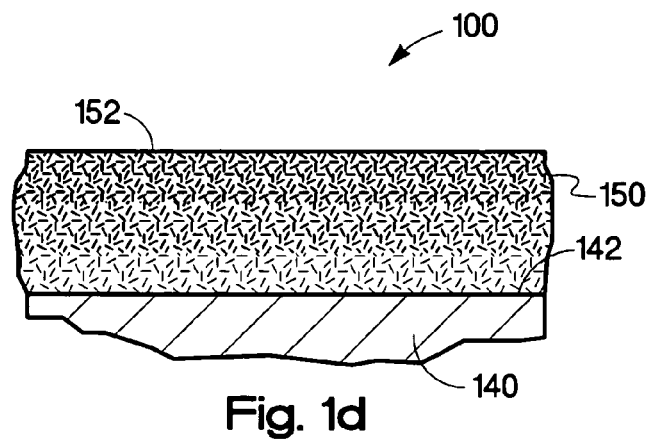
FIG. 1d is a cross-sectional view of a layer having a density gradient according to an embodiment of the present invention.

A process utilized to create a density gradient layer according to an embodiment of the present invention is illustrated in FIGS. 1a-1c in cross-sectional views. In this embodiment, vapor source 120 produces a vapor stream of a specified material where the vapor stream has non-uniform flux 122 formed in at least one direction. Generally, vapor source 120 has a cylindrical shape and produces a cylindrically shaped vapor stream having a flux gradient in the radial direction. However, in alternate embodiments, vapor source 120 may have any of a wide range of geometric shapes such as square, rectangular, or polygonal producing a wide range of geometrically shaped vapor streams with a wide range of flux gradients. For example, the shape of the vapor stream may be achieved by the shape of the target, by the utilization of a shutter or mask, or by combinations thereof. For illustrative purposes only FIGS. 1a-1c depict the flux gradient in the X direction. In this embodiment, substrate 140 is mounted to moveable substrate holder 116. As substrate holder 116 and substrate 140 are moved from position A to position B, as illustrated in FIGS. 1a and 1b gradient layer 150 of the specified material is formed on substrate 140 as illustrated in FIG. 1d. In this embodiment, gradient layer 150 includes a density gradient, of the specified material, that varies from being less dense at first major surface 142, of substrate 140 of electronic device 100, and increases in density moving perpendicular from first major surface 142 to gradient layer surface 152 where the specified material is more dense. In an alternate embodiment, gradient layer 150 may be formed having the more dense portion of the layer at first major surface 152 with the least dense portion at gradient layer surface 142 by starting at position B and moving substrate 140 to position A.

Figure 1E:
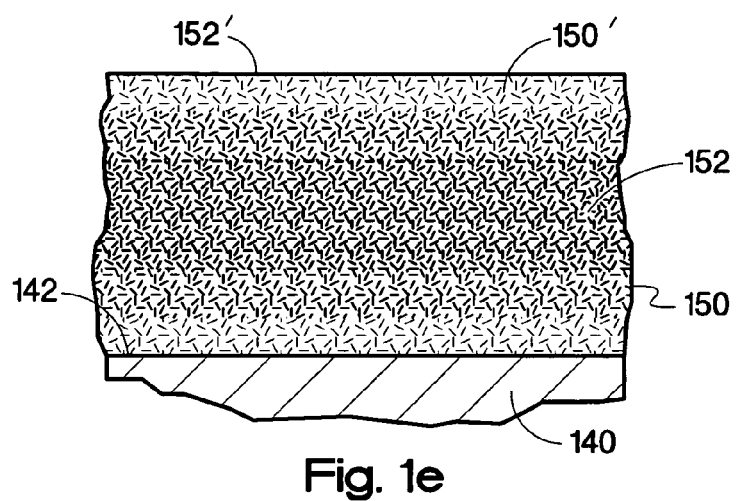
FIG. 1e is a cross-sectional view of a layer having a density gradient according to an alternate embodiment of the present invention.
Figure 1F:
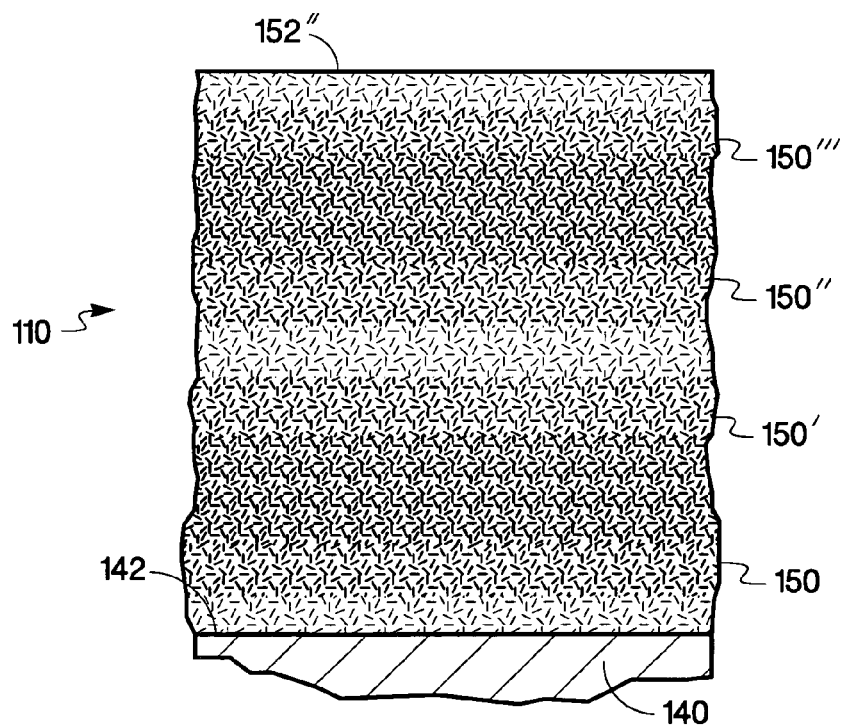
FIG. 1f is a cross-sectional view of a multilayer structure having a periodic variation in density according to an alternate embodiment of the present invention.

As substrate holder 116 and substrate 140 are moved from position B in FIG. 1b back to position A, as illustrated in FIGS. 1b and 1c, gradient layer 150' of the specified material is formed on gradient layer 150 as illustrated in FIG. 1e. In this case the density gradient, of the specified material, varies from a less dense region at substrate surface 142 to a higher density in the middle region of the two gradient layers (i.e. gradient layer surface 152) to a less dense region at gradient layer surface 152' forming a thin film having a double density gradient. In an alternate embodiment, the double layer density gradient also may be formed by translating substrate 140 in a single pass from position A through position B to position C. By making 4 passes from A to B (e.g. A-B-A-B-A) or 2 passes from A to C (e.g. A-C-A) multilayer film 110, as illustrated in FIG. 1f, may be formed having a density gradient that varies periodically. As illustrated in FIG. 1f, multilayer film 110 includes 4 density gradient sub-layers depicted as 150, 150', 150", and 150'" in a film morphology that has a porosity or density that goes from low to high to low to high to low in moving away from substrate surface 142 toward gradient layer surface 152". This process may be repeated to generate a multilayer film comprising many layers.

In this embodiment, vapor source 120 may be any of a wide range of vapor sources, such as a sputtering target, a thermal or electron beam evaporation source, or a molecular beam source. Substrate 140, in this embodiment, may be formed from any of a wide range of materials or combinations of materials, such as various glasses, for example, any of the borosilicate, soda lime or quartz glasses (including crystalline and amorphous forms); materials such as silicon oxide including silicon dioxide or silicon oxynitride, or silica mixed with oxides of, for example, potassium, calcium, barium or lead; ceramics such as aluminum oxide, boron nitride, silicon carbide, and sapphire; metals; semiconductors such as silicon, gallium arsenide, indium phosphide, and germanium; and various polymers such as polycarbonates, polyethylene terephthalate, polystyrene, polyimides, and acrylates including polymethylacrylate are just a few examples of the materials that may be utilized. Accordingly, the present invention is not intended to be limited to those devices fabricated in silicon semiconductor materials, but includes those devices fabricated in one or more of the available semiconductor materials and technologies known in the art, such as thin-film-transistor (TFT) technology using polysilicon on glass substrates. Further, substrate 140 is not restricted to typical wafer sizes, and may include processing a polymer sheet or film or glass sheet or, for example, a single crystal sheet or a substrate handled in a different form and size than that of conventional wafers or substrates. The actual substrate material utilized will depend on various factors such as the particular material utilized to form the multilayer structure, the particular device in which the photonic structure will be utilized, the expected lifetime of the photonic structure, and the particular environment to which the photonic structure will be subjected.

In this embodiment multilayer 110 also may be formed from any of a wide range of materials or combinations of materials including semiconductors and ceramics such as borides, nitrides, and carbides. In one embodiment, a samarium strontium cobalt oxide ($Sm_{0.5}Sr_{0.5}CoO_3$) sputtering target was utilized to form a 5 layer film with each layer about 60 nanometer thick. The multilayer was sputter deposited by radio frequency (RF) magnetron sputtering utilizing a gas composition of 5 percent oxygen in argon at a pressure of 10 milliTorr (mTorr), with a flow rate of 49 sccm (flow of Standard gas at a pressure of one atmosphere at a rate of one Cubic Centimeter per Minute) and a power of 250 Watts (W) utilizing a 3 inch target, and a transition speed in the range from about 2 centimeters per minute to about 10 centimeters per minute. In alternate embodiments, dc plasma powers in the range from about 10 W to about 400W utilizing a three inch target also may be utilized for sputtering metals and ceramics that do not, generally, present charging problems; or for RF sputtering powers from about 100 W to about 400 W also may be utilized. In still other embodiments, a DC-Pulse power source also may be utilized when sputtering materials that charge. In addition, transition speeds in the range from about 0.7 centimeters per minute or higher also may be utilized. In alternate embodiments, other vapor sources such as, samarium doped ceria ($Ce_{0.8}Sm_{0.2}O_{1.9}$), and yttria-stabilized zirconia, $ZrO_2$, 8% $Y_2O_3$ also may be utilized.

Figure 2:
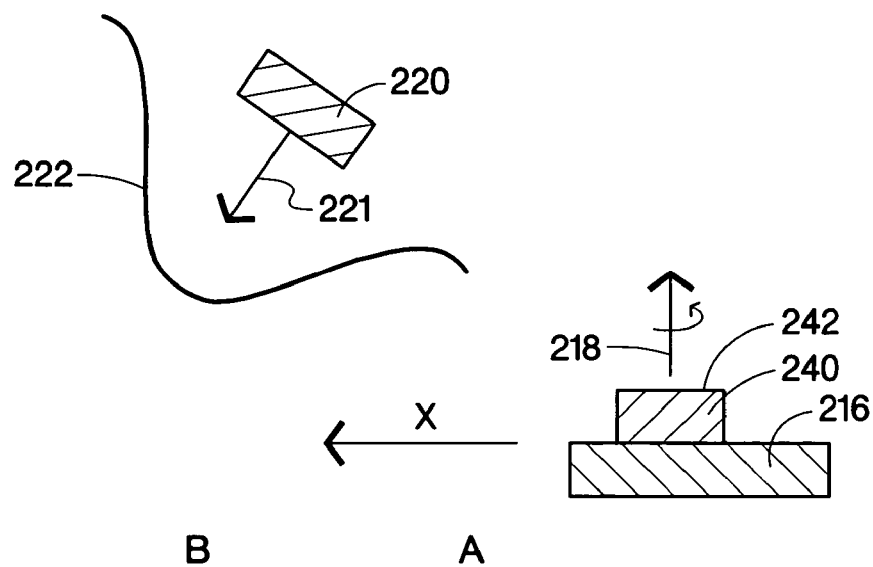
FIG. 2 is a cross-sectional view of a vapor source tilted with respect to a rotatable substrate according to an alternate embodiment of the present invention.

An alternate embodiment of a process utilized to create a multilayer photonic structure, is shown in a cross-sectional view, in FIG. 2. In this embodiment, vapor source 220 includes vapor source central axis 221 that is tilted at an angle to the surface normal of substrate surface 242. In addition, substrate 240 is also rotatable about substrate holder central axis 218 of substrate holder 216 where the surface normal of substrate 240 and substrate holder central axis 218 are substantially parallel. However, in alternate embodiments, the substrate surface normal and the substrate holder axis may also be tilted at an angle relative to each other. In still other embodiments, the surface normal of substrate 240 and vapor source central axis 221 are non-coplanar. In this embodiment, by rotating substrate 240 about substrate holder central axis 218 and reciprocally translating substrate 240 from position A to position B, a pre-determined number of times, a multilayer film having a desired number of sub-layers may be formed. By controlling various parameters such as the translation distance and speed, the rotational speed, tilt angle and the non-uniformity of non-uniform flux 222 the density gradient of each sub-layer can be independently controlled.

Figure 3A:
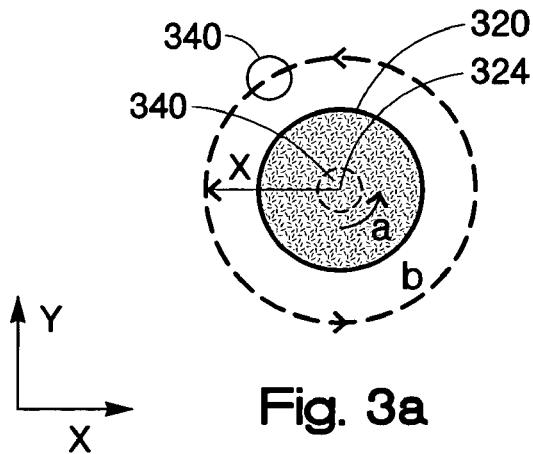
FIG. 3a is a plan view of a vapor source and substrate illustrating movement in two dimensions of the substrate relative to the vapor source according to an alternate embodiment of the present invention.
Figure 3B:
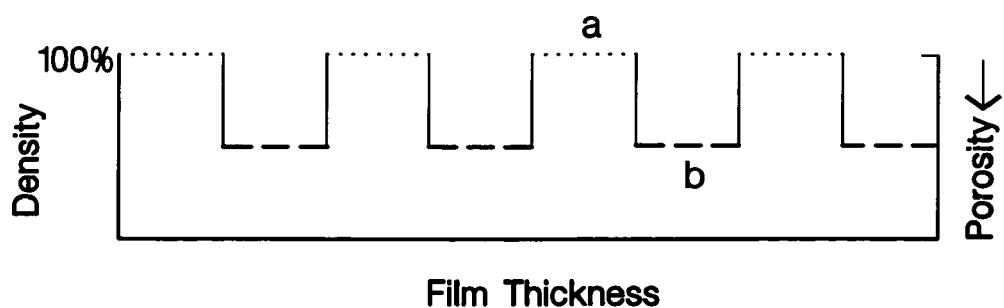
FIG. 3b is a graph of the density of a thin film as a function of film thickness according to an embodiment of the present invention.
Figure 3C:
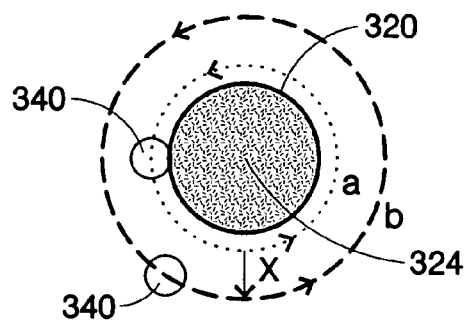
FIG. 3c is a plan view of a vapor source and substrate illustrating movement in two dimensions of the substrate relative to the vapor source according to an alternate embodiment of the present invention.
Figure 3D:
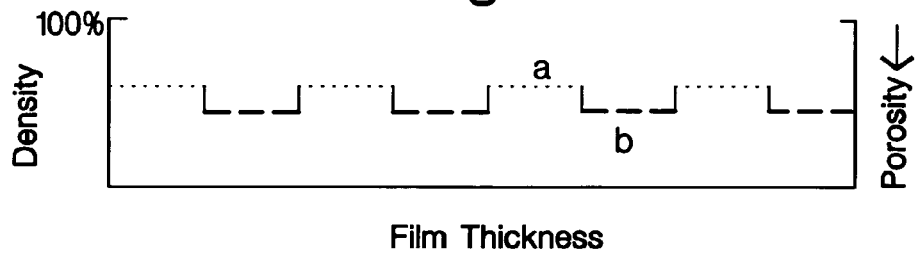
FIG. 3d is a graph of the density of a thin film as a function of film thickness according to an embodiment of the present invention.
Figure 3E:
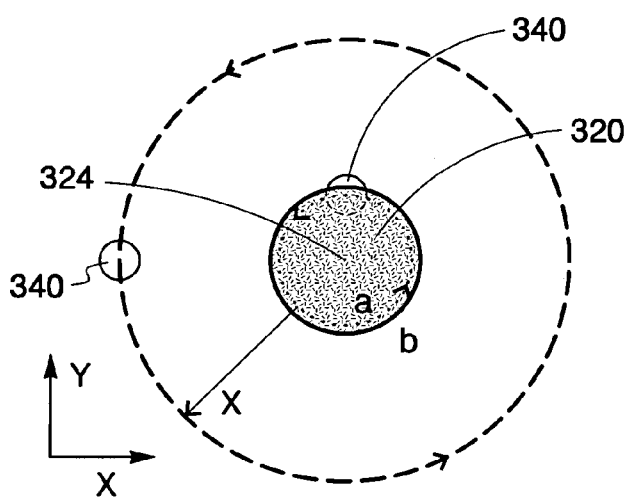
FIG. 3e is a plan view of a vapor source and substrate illustrating movement in two dimensions of the substrate relative to the vapor source according to an alternate embodiment of the present invention.
Figure 3F:
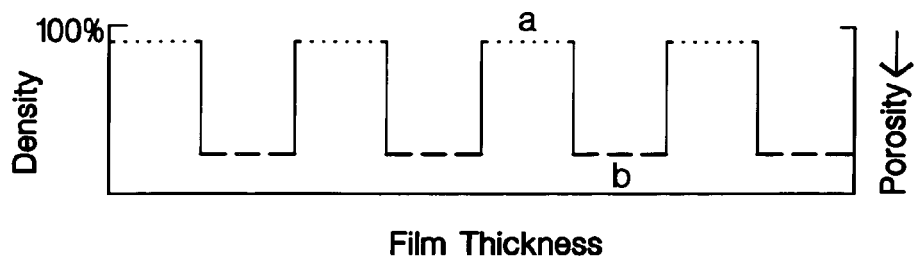
FIG. 3f is a graph of the density of a thin film as a function of film thickness according to an embodiment of the present invention.

An alternate embodiment of a process utilized to create a multilayer photonic structure, is shown in a plan view, in FIGS. 3a, 3c, and 3e. In this embodiment, vapor source 320 is a cylindrically or disk shaped sputter target having vapor source central axis 324. In addition, substrate 340 is rotated about vapor source central axis 324 and is moved in a stepwise manner between two different positions (designated "a" and "b") within the non-uniform flux of vapor source 320 generating a film having a substantially step function change in the films density or porosity. In this embodiment, position "a" is directly under the central portion of the radially non-uniform flux of vapor source 320 and position "b" is at a position of lower flux. As illustrated in FIG. 3a, by repeatedly moving substrate 340 in a substantially step function manner from position "a" to position "b" (i.e. represented by the arrow and distance X shown in FIG. 3a) a multilayer film is generated having a substantially step function change in density. An example of such a multilayer film is illustrated in FIG. 3b showing the periodic variation in density as a function of film thickness. FIGS. 3c-3f illustrates how both the maximum and minimum density of a multilayer film may be controlled. In FIG. 3c, substrate 340 in position "a" is in a region of lower flux than the central region shown in FIG. 3a. Substrate 340 is rotated about the central axis of vapor source 320 a pre-selected number of times. Substrate 340 is then moved to position "b" a region of lower flux, and in this particular example, the same position as shown in FIG. 3a. The periodic variation in the density of the multilayer film as a function of thickness, as illustrated in FIG. 3d, has a lower maximum density than that produced in FIGS. 3a-3b, but the multilayer film has the same lower or minimum density as that shown in FIGS. 3a-3b. Another example is illustrated in FIGS. 3e-3f. In FIG. 3e, substrate 340 is in position "a" at a position that is intermediate between that shown in FIGS. 3a and 3c. Position "b," in this example, is a region of lower flux than position "b" shown in FIGS. 3a and 3c. The density of the multilayer film as a function of thickness, as illustrated in FIG. 3f, has maximum density slightly less than 100 percent and a minimum density substantially less than that shown in FIGS. 3b and 3d. In alternate embodiments, substrate 340 may be moved from a position of lower flux to a position of higher flux to generate multilayer films whose density gradient starts with a low density closest to the substrate and then increases in moving away from the substrate. In other embodiments, the substrate may be tilted with respect to the vapor source to generate an even greater change in density or porosity. In still other embodiments, the speed or rate of change in moving substrate 340 from a first position (i.e. position "a") to a second position (i.e. position "b") also may be controlled to generate multilayer films having a slope or controlled profile in the change in the density gradient. For example, substrate 340 may be moved in a linear manner generating a density gradient having a linear slope between the maximum and minimum values. A non-linear translation is another example generating a non-linear slope in the density gradient. In addition, in all of these embodiments, substrate 340 also may be rotated about the central axis of the substrate holder providing for an increase in the lateral homogeneity of each sub-layer of the multilayer film when desired.

Figure 4A:
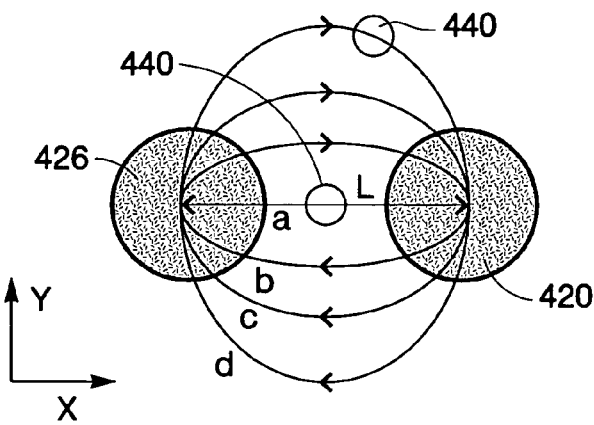
FIG. 4a is a plan view of two vapor sources and a substrate illustrating movement in two dimensions of the substrate relative to the vapor sources according to an alternate embodiment of the present invention.
Figure 4B:
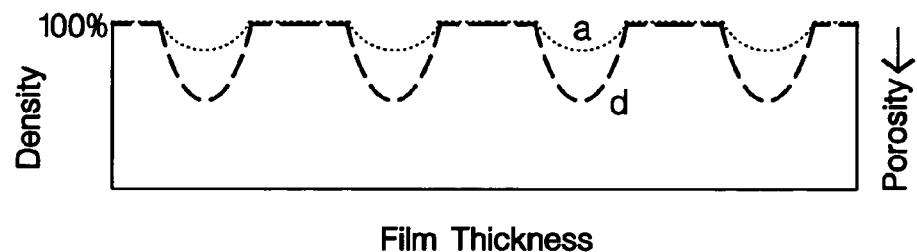
FIG. 4b is a graph of the density of two thin films as a function of film thickness according to embodiments of the present invention.
Figure 4C:
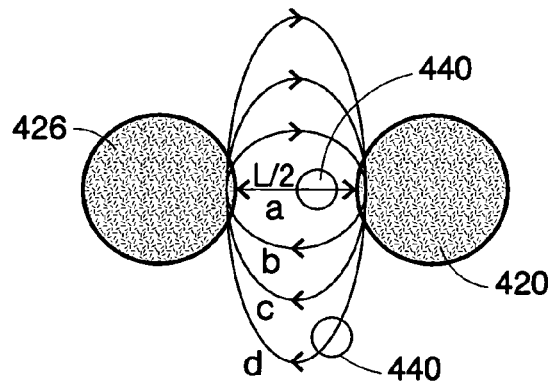
FIG. 4c is a plan view of two vapor sources and a substrate illustrating movement in two dimensions of the substrate relative to the vapor sources according to an alternate embodiment of the present invention.
Figure 4D:
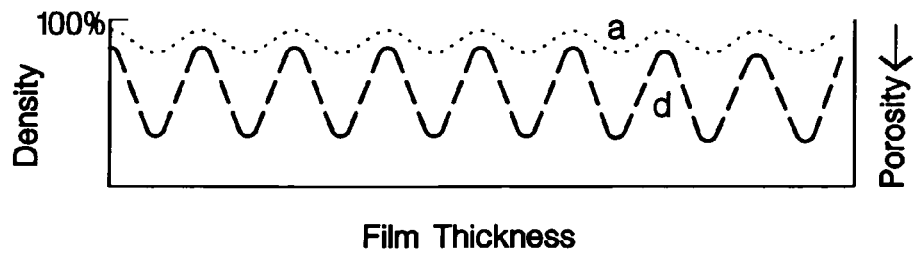
FIG. 4d is a graph of the density of two thin films as a function of film thickness according to embodiments of the present invention.
Figure 4E:
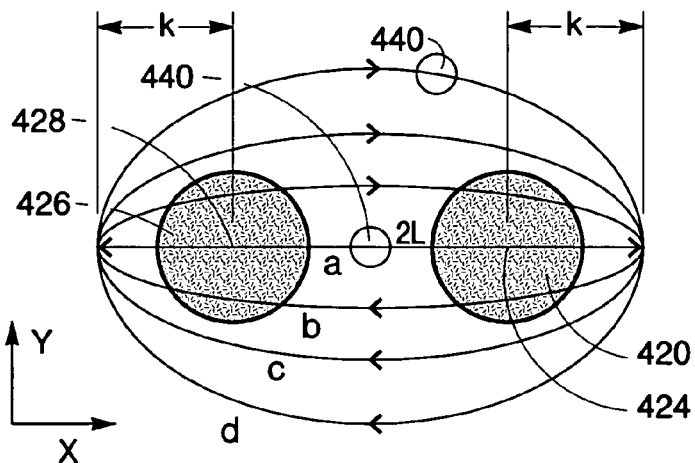
FIG. 4e is a plan view of two vapor sources and a substrate illustrating movement in two dimensions of the substrate relative to the vapor sources according to an alternate embodiment of the present invention.
Figure 4F:
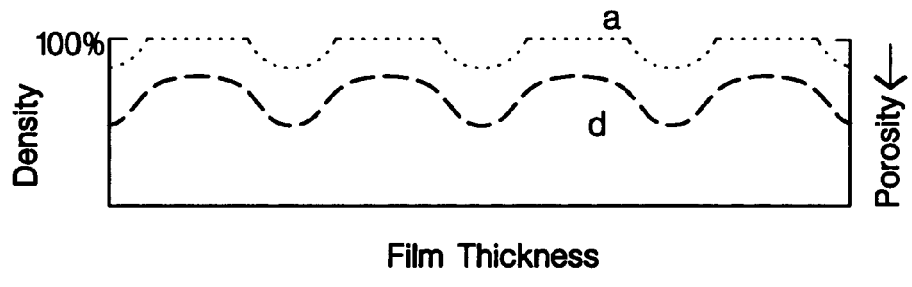
FIG. 4f is a graph of the density of two thin films as a function of film thickness according to embodiments of the present invention.

An alternate embodiment of a process utilized to create a multilayer photonic structure, is shown in a plan view, in FIGS. 4a, 4c, and 4e. In this embodiment, two vapor sources each producing a vapor stream of the same material are utilized to generate multilayer films having a periodic variation in density as a function of film thickness. Vapor sources 420 and 426 each produce a vapor stream having a non-uniform flux in at least one direction and are separated by a distance L. Substrate 440, in this embodiment, is smaller than the size of vapor sources 420 and 426. Generally, substrate 440 is about a fourth the size of the target or smaller. In this embodiment, substrate 440 may be moved either a pre-selected distance linearly in at least a portion of the non-uniform vapor fluxes of both targets as illustrated in FIGS. 4a, 4c, and 4e and denoted by arrow "a;" or substrate 440 may be moved in two dimensions as denoted by curved trajectory lines "b", "c", and "d" in FIGS. 4a, 4c, and 4e. As illustrated in FIG. 4a by reciprocally translating substrate 440 between the central region of vapor sources 420 and 426 a multilayer film is formed having an oscillating density gradient as shown in FIG. 4b where the density of the film as a function of film thickness is illustrated. By moving substrate 440 in a curvilinear manner through the central portion of both vapor sources, a multilayer film is formed having a density gradient that oscillates from the maximum value to a lower value than that obtained by reciprocally translating between the two central regions as illustrated by curve d in FIG. 4b. In the embodiment shown in FIGS. 4a-4b, substrate 440 passes through the central portion of the non-uniform vapor fluxes of each vapor source producing a multilayer film having a density gradient oscillating from the maximum density or porosity for that particular vapor source to some lesser value that depends on various factors such as particular path utilized, the particular non-uniformity in flux as well as the particular distance L utilized to separate the two vapor sources. In the embodiment shown in FIGS. 4c-4d substrate 440 is moved between the two vapor sources forming multilayer films having relative maximum density gradient less than that illustrated in FIGS. 4a-4b. Again by utilizing a curvilinear path the difference between the relative minimum and maximum can be increased. In the embodiment shown in FIGS. 4e-4f substrate 440 is moved across both vapor sources forming multilayer films having a density gradient that starts with a low density closest to the substrate and then increases to a higher density moving away from the substrate as illustrated in curves a and d in FIG. 4f. In this embodiment, substrate 440 may be reciprocally translated a specified distance k beyond central axis 424 of vapor source 420 or a distance k beyond central axis 428 of vapor source 426 or both. In alternate embodiments, many other translations, movements, and rotations also may be utilized to generate complex paths in which substrate 440 may be moved to generate various multilayer structures having complex density gradients. As noted above for those embodiments shown in FIGS. 3a-3f, in all of these embodiments shown in FIGS. 4a-4f substrate 440 also may be rotated about the central axis of the substrate holder providing for an increase in the lateral homogeneity of each sub-layer of the multilayer film when desired. These examples are just a few of the wide variety of density gradients that may be formed in a multilayer film utilizing the present invention.

Figure 5A:
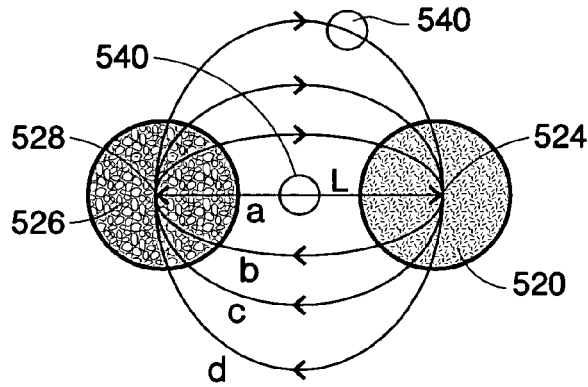
FIG. 5a is a plan view of two vapor sources producing vapor streams of two dissimilar materials and a substrate illustrating movement in two dimensions of the substrate relative to the vapor sources according to an alternate embodiment of the present invention.
Figure 5B:
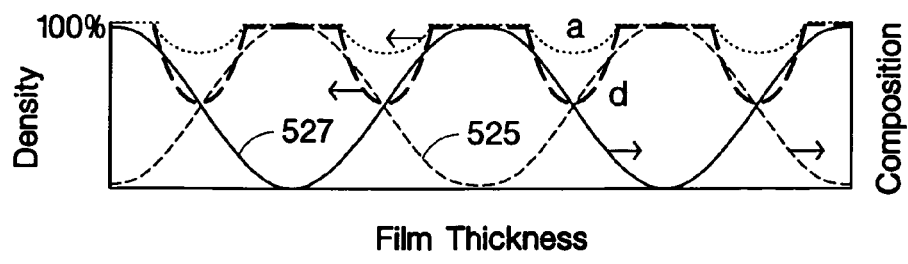
FIG. 5b is a graph of the density of two thin films as a function of film thickness according to embodiments of the present invention.
Figure 5C:
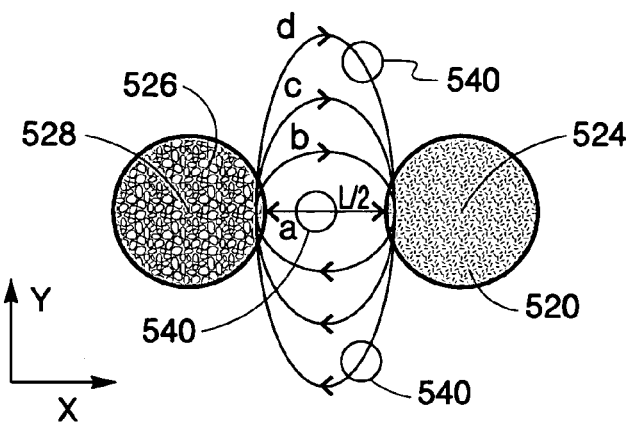
FIG. 5c is a plan view of two vapor sources producing vapor streams of two dissimilar materials and a substrate illustrating movement in two dimensions of the substrate relative to the vapor sources according to an alternate embodiment of the present invention.
Figure 5D:
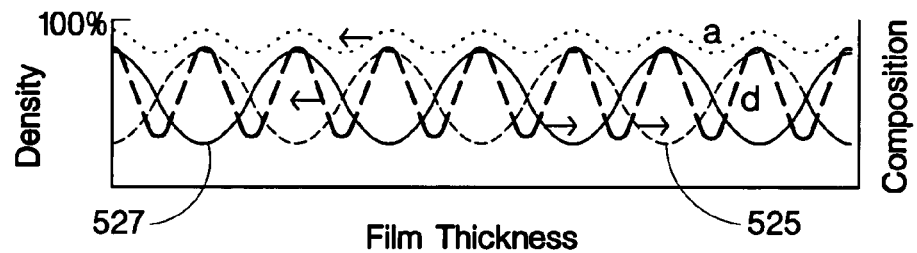
FIG. 5d is a graph of the density of two thin films as a function of film thickness according to embodiments of the present invention.
Figure 5E:
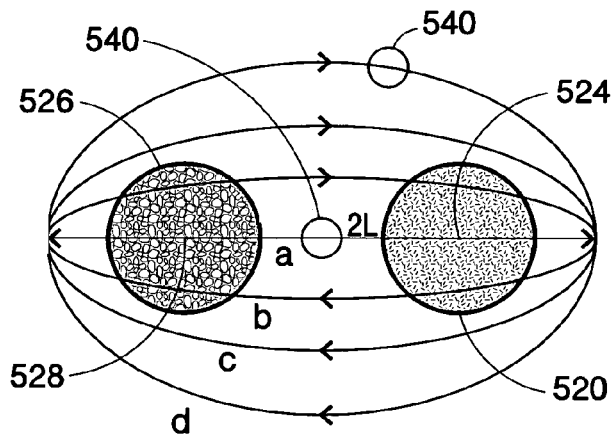
FIG. 5e is a plan view of two vapor sources producing vapor streams of two dissimilar materials and a substrate illustrating movement in two dimensions of the substrate relative to the vapor sources according to an alternate embodiment of the present invention.
Figure 5F:
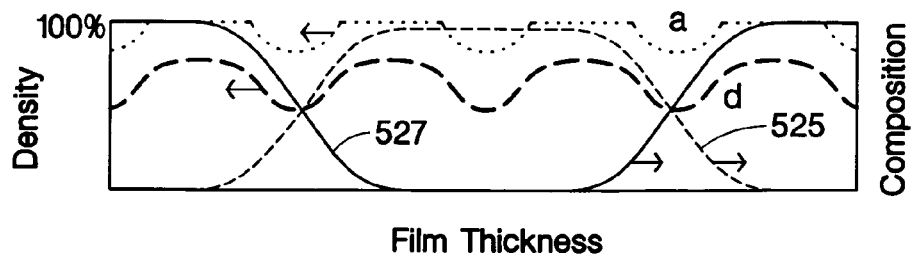
FIG. 5f is a graph of the density of two thin films as a function of film thickness according to embodiments of the present invention.

An alternate embodiment of a process utilized to create a multilayer photonic structure, is shown in a plan view, in FIGS. 5a, 5c, and 5e. In this embodiment, again two vapor sources are utilized, however, first vapor source 520 produces a vapor stream of a first material and second vapor source 526 produces a vapor stream of a second material. Vapor sources 520 and 526 each produce a vapor stream having a non-uniform flux in at least one direction and the two sources are separated by a distance L. Substrate 540, in this embodiment, is smaller than the size of vapor sources 520 and 526. Generally, substrate 540 is about a fourth the size of the vapor sources or smaller. In the embodiments shown in FIGS. 5a, 5c, and 5e substrate 540 may be moved, rotated, and translated in a manner similar to that described in FIGS. 4a, 4c, and 4e. In addition, as described above a wide variety of other trajectories for substrate 540 also may be utilized to generate complex density gradients in multilayer films. In this embodiment, both a periodic compositional variation and a periodic variation in density or porosity as a function of film thickness for a particular trajectory is illustrated in the graphs shown in FIGS. 5b, 5d, and 5f. For illustrative purposes only the same density gradients and the same trajectories are shown in FIGS. 5a-5f as shown in FIGS. 4a-4f; however, other density gradients and trajectories also may be utilized in this embodiment. In addition, again for illustrative purposes only, the non-uniformity in the flux of the two vapor streams is the same; however, in alternate embodiments, the non-uniformity in the flux of the two vapor streams may be dissimilar. The change in composition of the multilayer film formed utilizing two vapor sources each generating a vapor stream of a different material is illustrated in FIG. 5b. The change in composition of the first material as a function of film thickness is illustrated by dashed line 525, and the change in composition of the second material as a function of film thickness is illustrated by solid line 527 in FIG. 5b. In this embodiment, substrate 540 begins its trajectory of movement in the central region of second vapor source 526 and then moves to the central region of first vapor source 520. As illustrated in FIG. 5b such movement of substrate 540 results in a multilayer film oscillating, in composition, between 100 percent of the second material (i.e. solid line 527) and 100 percent of the first material (i.e. solid line 525), where this oscillation may be repeated many times. FIG. 5d illustrates a multilayer film having a periodic compositional profile where each sub-layer includes a mixture of the first and second materials as well as a periodic variation in density or porosity. In both FIGS. 5b and 5d the density gradient is of the same thickness as the compositional gradient. FIG. 5f illustrates a multilayer film where the periodic compositional profile is essentially twice the thickness as the density gradient profile. As noted above substrate 540 also may be tilted relative to vapor sources 520 and 526 and substrate 540 also may be rotated about the central axis of the substrate holder providing for even more complex density and compositional profiles as a function of thickness as well as increasing the lateral homogeneity of each sub-layer of the multilayer film.

What is claimed is:

1. A method for making a photonic structure, comprising:
creating a first vapor stream of a first vapor material, said first vapor stream having a first non-uniform flux in at least one direction, and having a first central axis;
translating at least a portion of a substrate in at least a portion of said first vapor stream, or rotating, about said first central axis, said at least a portion of a substrate in said at least a portion of said first vapor stream;
depositing said first vapor material on a first major surface of said substrate; and
forming a first layer and a density gradient in said first layer during deposition, said first layer disposed on said first major surface, wherein said density gradient is in a direction perpendicular to said first major surface.

2. The method in accordance with claim 1, wherein forming said first layer further comprises forming a multilayer structure of said first vapor material on said substrate, said multilayer structure having a periodic variation in density perpendicular to said first major surface.

3. The method in accordance with claim 1, wherein moving said substrate in at least said portion of said first vapor stream further comprises rotating at least said portion of said substrate in at least said portion of said first vapor stream.

4. The method in accordance with claim 1, wherein depositing said first vapor material further comprises depositing said first vapor material on said first major surface of said substrate, said first major surface having a substrate surface normal, wherein said substrate surface normal and said first central axis are not coplanar.

5. The method in accordance with claim 1, wherein rotating about said first central axis at least a portion of said substrate further comprises rotating said substrate about a substrate holder central axis.

6. The method in accordance with claim 1, wherein said translating at least a portion of a substrate in at least a portion of said first vapor stream further comprises translating said at least a portion of a substrate through said at least a portion of said first vapor stream.

7. The method in accordance with claim 1, wherein said translating at least a portion of a substrate in at least a portion of said first vapor stream further comprises reciprocally translating said at least a portion of a substrate in said at least a portion of said first vapor stream.

8. The method in accordance with claim 1, further comprising:

creating a second vapor stream of said first vapor material, said second vapor stream having a second non-uniform flux in at least one direction; and moving at least said portion of said substrate in at least a portion of said second vapor stream.

9. The method in accordance with claim 8, wherein said first non-uniform flux of said first vapor stream decreases radially from said first central axis, and wherein creating said second vapor stream further comprises creating said second vapor stream having a second central axis, wherein said second non-uniform flux decreases radially from said second vapor central axis.

10. The method in accordance with claim 9, wherein translating at least a portion of a substrate in at least a portion of said first vapor stream further comprises reciprocally translating said at least a portion of a substrate between said first central axis and said second central axis.

11. The method in accordance with claim 9, wherein translating at least a portion of a substrate in at least a portion of said first vapor stream further comprises moving said at least a portion of a substrate in a curvilinear manner between said first central axis and said second central axis.

12. The method in accordance with claim 9, wherein said first central axis and said second central axis are separated a distance L.

13. The method in accordance with claim 12, wherein said translating at least a portion of a substrate in at least a portion of said first vapor stream further comprises reciprocally translating said at least a portion of a substrate a specified distance k beyond said first central axis and said second central axis.

14. The method in accordance with claim 13, wherein reciprocally translating at least said portion of said substrate said specified distance k further comprises reciprocally translating at least said portion of said substrate said specified distance k, wherein said specified distance k equals said distance L.

15. The method in accordance with claim 12, wherein translating at least a portion of a substrate in at least a portion of said first vapor stream further comprises moving said at least a portion of a substrate in a curvilinear manner a specified distance k beyond said first central and said second central axes.

16. The method in accordance with claim 15, wherein moving at least said portion of said substrate in said curvilinear manner said specified distance k, wherein said specified distance k equals said distance L.

17. The method in accordance with claim 12, wherein translating at least a portion of a substrate in at least a portion of said first vapor stream further comprises reciprocally translating said at least a portion of a substrate a specified distance k between said first central axis and said second central axis, wherein said specified distance k is less than said distance L.

18. The method in accordance with claim 17, wherein said specified distance k is said distance L divided by two.

19. The method in accordance with claim 1, wherein creating said first vapor stream further comprises creating said first vapor stream from a source, said first vapor stream having a first vapor stream central axis and a vapor stream lateral dimension X, wherein said first non-uniform flux decreases from a maximum value at said first vapor stream central axis to essentially zero at said vapor stream lateral dimension X; and wherein said substrate has a substrate dimension R and a substrate central axis perpendicular to said first major surface.

20. The method in accordance with claim 19, wherein said translating at least a portion of a substrate in at least a portion of said first vapor stream further comprises translating said substrate first major surface laterally in a direction perpendicular to said substrate central axis.

21. The method in accordance with claim 1, further comprising:
creating a second vapor stream of a second vapor material, said second vapor stream having a second non-uniform flux in at least one direction;
moving at least said portion of said substrate in at least a portion of said second vapor stream; and
forming a multilayer structure having alternating layers of said first and said second vapor materials, wherein each layer of said first vapor material has a first density gradient perpendicular to said first major surface, and wherein each layer of said second vapor material has a second density gradient perpendicular to said first major surface.

22. A method of making a photonic structure, comprising:
creating a first vapor stream of a first vapor material, said first vapor stream having a non-uniform density in at least one direction, and having a first central axis;
translating at least a portion of a substrate in at least a portion of said first vapor stream, or rotating about said first central axis said at least a portion of a substrate in said at least a portion of said first vapor stream, said substrate having a first major surface;
creating a first layer of said first vapor material on at least a portion of said substrate, said first layer having a first density; and
creating a second layer of said first vapor material on said first layer, said second layer having a second density different from said first density.

* * * * *